(12) United States Patent
Ozaki et al.

(10) Patent No.: US 7,830,012 B2
(45) Date of Patent: Nov. 9, 2010

(54) MATERIAL FOR FORMING EXPOSURE LIGHT-BLOCKING FILM, MULTILAYER INTERCONNECTION STRUCTURE AND MANUFACTURING METHOD THEREOF, AND SEMICONDUCTOR DEVICE

(75) Inventors: Shirou Ozaki, Kawasaki (JP); Yoshihiro Nakata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/728,480

(22) Filed: Mar. 22, 2010

(65) Prior Publication Data

US 2010/0176496 A1 Jul. 15, 2010

Related U.S. Application Data

(62) Division of application No. 11/477,377, filed on Jun. 30, 2006, now Pat. No. 7,728,065.

(30) Foreign Application Priority Data

Feb. 14, 2006 (JP) .............................. 2006-037025

(51) Int. Cl.
*H01L 23/48* (2006.01)
*H01L 23/52* (2006.01)
*H01L 29/40* (2006.01)

(52) U.S. Cl. ...................... 257/758; 438/118; 438/622; 524/588; 525/474; 525/477; 528/34; 528/26; 528/29; 528/14; 528/35

(58) Field of Classification Search ................. 257/758; 438/118, 622; 524/588; 525/474, 477; 528/34, 528/26, 29, 14, 35
See application file for complete search history.

(56) References Cited

U.S. PATENT DOCUMENTS 7,297,360 B2 11/2007 Yoshioka et al.

(Continued)

FOREIGN PATENT DOCUMENTS

CN 1446374 A 10/2003

(Continued)

OTHER PUBLICATIONS

Chinese Office Action issued Apr. 17, 2009 in corresponding Chinese Patent Application No. 200610105675.8.
English translation of the German Office Action publication No. 102006029334 dated Dec. 22, 2006.

*Primary Examiner*—Mary Wilczewski
*Assistant Examiner*—Telly D Green
(74) *Attorney, Agent, or Firm*—Westerman, Hattori, Daniels & Adrian, LLP

(57) ABSTRACT

To provide a material for forming an exposure light-blocking film which includes at least one of a silicon compound expressed by the following structural formula (1) and a silicon compound expressed by the following structural formula (2), wherein at least one of $R^1$ and $R^2$ is replaced by a substituent capable of absorbing exposure light.

Structural Formula (1)

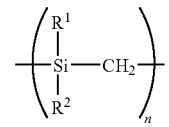

(where $R^1$ and $R^2$ may be the same or different, and each represents any one of a hydrogen atom, alkyl group, alkenyl group, cycloalkyl group and aryl group which are optionally substituted, and n is an integer of 2 or greater)

Structural Formula (2)

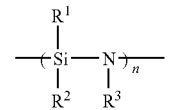

(where $R^1$, $R^2$ and $R^3$ may be the same or different, at least one of $R^1$, $R^2$ and $R^3$ represents a hydrogen atom and the others represent any one of an alkyl group, alkenyl group, cycloalkyl group and aryl group which are optionally substituted, and n is an integer of 2 or greater).

19 Claims, 8 Drawing Sheets

U.S. PATENT DOCUMENTS

| | | |
|---|---|---|
| 2001/0033026 A1 | 10/2001 | Nakata et al. |
| 2003/0162412 A1 | 8/2003 | Chung |
| 2004/0110896 A1 | 6/2004 | Yoshioka et al. |
| 2007/0020834 A1 | 1/2007 | Hirai et al. |
| 2007/0021580 A1 | 1/2007 | Nakagawa et al. |
| 2007/0026580 A1 | 2/2007 | Fujii |

FOREIGN PATENT DOCUMENTS

| | | |
|---|---|---|
| DE | 69115632 T2 | 8/1996 |
| DE | 10113110 A1 | 10/2001 |
| DE | 102005008857 A1 | 9/2006 |
| EP | 0481434 A2 | 4/1992 |
| EP | 1427004 A2 | 6/2004 |
| JP | 7-202040 A | 8/1995 |
| JP | 8-6014 B2 | 1/1996 |
| JP | 8-287715 A | 11/1996 |
| JP | 10-256363 A | 9/1998 |
| JP | 2004-127606 A | 4/2004 |
| JP | 2004-153147 A | 5/2004 |
| WO | 2004/040635 A1 | 5/2004 |
| WO | 2006/056285 A1 | 6/2006 |

MATERIAL FOR FORMING EXPOSURE LIGHT-BLOCKING FILM, MULTILAYER INTERCONNECTION STRUCTURE AND MANUFACTURING METHOD THEREOF, AND SEMICONDUCTOR DEVICE

CROSS-REFERENCE TO RELATED APPLICATIONS

This application is based upon and claims the benefits of the priority from the prior Japanese Patent Application No. 2006-037025 filed on Feb. 14, 2006, the entire contents of which are incorporated herein by reference. This application is a divisional of U.S. application Ser. No. 11/477,377 filed on Jun. 30, 2006.

BACKGROUND OF THE INVENTION

1. Field of the Invention

The present invention relates to an exposure light-blocking film that is suitable for a multilayer interconnection structure in a semiconductor integrated circuit and can efficiently block exposure light (e.g., ultraviolet light) applied to a porous insulating film; to a material for forming an exposure light-blocking film, which is suitably used for the formation of the exposure light-blocking film; to a multilayer interconnection structure provided with the exposure light-blocking film and a manufacturing method thereof; and to a semiconductor device provided with the multilayer interconnection structure and a manufacturing method thereof.

2. Description of the Related Art

As the scale of integration of semiconductor integrated circuits and chip density have been increasing, so too has been, in particular, the demand for multilayered semiconductor chips. Against this background, the interval between adjacent interconnections, or interconnection interval, has become smaller and smaller, leading to a problem of interconnection delay due to an increased capacity between interconnections. Here, the interconnection delay (T) is represented by the equation $T \propto RC$, which means that (T) is influenced by the interconnection resistance (R) and the capacity between adjacent interconnections (C). The relationship between permittivity ($\epsilon$) and capacity (C) is represented by the equation $C = \epsilon_0 \epsilon_r \cdot S/d$ (where S is an electrode area, $\epsilon_0$ is the permittivity of vacuum, $\epsilon_r$ is the permittivity of an insulating film, and d is the interconnection interval). The reduction of the capacity (C) can be achieved by reducing the interconnection thickness and the electrode area, though, reducing the interconnection thickness causes an increase in the interconnection resistance (R), making it impossible to achieve a speedup. Accordingly, reducing the permittivity of an insulating film is an effective way to achieve a speedup by minimizing the interconnection delay (T).

In a semiconductor device with a multilayer interconnection structure the interval between adjacent interconnections has become smaller and smaller with the recent trend moving toward an increased scale of integration of semiconductor integrated circuits and greater chip density, leading to an increased impedance of metal interconnections due to electrostatic induction. For this reason, there is a great concern that the response speed will be reduced and power consumption will be increased. To avoid this problem, it is necessary to reduce the permittivity of an interlayer insulating film as small as possible, which is provided between the semiconductor substrate and metal interconnections or between interconnection layers.

Materials for conventional insulating films include inorganic materials such as silicon dioxide ($SiO_2$), silicon nitride (SiN) and phosphosilicate glass (PSG), and organic materials such as polyimides. The CVD-$SiO_2$ film, an insulating film frequently used in semiconductor devices, however, has a permittivity of as high as 4. In addition, the SiOF film, an insulating film explored as a candidate for a low-permittivity CVD film, has a permittivity of as small as 3.3 to 3.5, but highly hygroscopic; therefore, the SiOF film has a problem that the permittivity increases with time. Moreover, a porous silica-based low-permittivity film has been proposed (see Japanese Patent Application Laid-Open (JP-A) No. 2004-153147). Since the production process for this porous film involves a pore formation step in which thermally decomposable components are heated, and evaporated or decomposed to form pores, it is possible to further reduce the permittivity of the porous film. At present, the pore size of this porous film, however, is large—10 nm or more. For this reason, increasing the porosity for reduced permittivity leads to a problem of increased permittivity and/or reduced film strength, caused due to moisture absorption.

At present, the following method has been explored to solve this kind of problem: After the deposition of an insulating film, the insulating film is cured by irradiation with ultraviolet light, plasmas, electron beams or the like to increase its film strength. However, ultraviolet light and plasmas unfavorably reach other films provided below the insulating film which is to be irradiated with them (or an exposure target). Thus, there is a concern about the use of ultraviolet light and plasmas because the thickness of lower interlayer insulating films may be reduced as a result of repeated curing operations. Moreover, there is a concern about the use of electron beams because their exposure energy is particularly high enough to undesirably damage transistors present in the lowermost layer.

It is an object of the present invention to solve the foregoing problems and to achieve the object described below.

More specifically, it is an object of the present invention to provide an exposure light-blocking film which has a high exposure light (particularly ultraviolet light) absorptivity, which efficiently blocks the exposure light that reaches porous insulating films present below an exposure target, and which is capable of reducing the permittivities of the porous insulating films without impairing their functions; a material for forming an exposure light-blocking film, which is suitably used for the formation of the exposure light-blocking film; a multilayer interconnection structure in which the parasitic capacity between adjacent interconnections can be reduced and an efficient mass-production method for the same; and a high-speed, highly-reliable semiconductor device provided with the multilayer interconnection structure and a manufacturing method thereof.

SUMMARY OF THE INVENTION

The means for solving the foregoing problems are listed in the appended claims. Specifically, the material of the present invention for forming an exposure light-blocking film includes at least one of a silicon compound expressed by the following structural formula (1) and a silicon compound expressed by the following structural formula (2), wherein in the structural formulae (1) and (2) at least one of $R^1$ and $R^2$ is replaced by a substituent capable of absorbing exposure light.

Structural Formula (1)

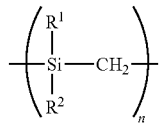

(where $R^1$ and $R^2$ may be the same or different, and each represents any one of a hydrogen atom, alkyl group, alkenyl group, cycloalkyl group and aryl group which are optionally substituted, and n is an integer of 2 or greater)

Structural Formula (2)

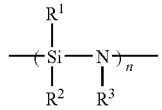

(where $R^1$, $R^2$ and $R^3$ may be the same or different, at least one of $R^1$, $R^2$ and $R^3$ represents a hydrogen atom and the others represent any one of an alkyl group, alkenyl group, cycloalkyl group and aryl group which are optionally substituted, and n is an integer of 2 or greater)

This material for forming an exposure light-blocking film has a high exposure light (e.g., ultraviolet light) absorptivity because some of the functional groups in silicon compounds expressed by the structural formulae (1) and (2) are replaced by substituents capable of absorbing exposure light (e.g., ultraviolet light). Thus, an exposure light-blocking film formed by use of the this material exhibits an exposure light blocking function, and thus can be suitably used for multilayer interconnection structures, various semiconductor devices and so forth—particularly for the multilayer interconnection structure and semiconductor device of the present invention.

The multilayer interconnection structure of the present invention includes at least an exposure light-blocking film, a porous insulating film, and an interconnection layer, and the exposure light-blocking film is formed by use of the material of the present invention for forming an exposure light-blocking film. For this reason, the exposure light-blocking film has excellent exposure light (e.g., ultraviolet light) absorptivity and exhibits an ultraviolet light blocking function. For example, when the exposure light-blocking film is formed on the porous insulating film, the exposure light (e.g., ultraviolet light) is prevented from reaching the porous insulating film. Thus, when a porous insulating film that has been deposited above the exposure light-blocking film is to be irradiated with exposure light (ultraviolet light) for curing, it is possible to efficiently prevent ultraviolet light from reaching other porous insulating films provided below the porous insulating film (or exposure target), thereby reducing damages to them caused as a result of repeated curing operations and preventing the reduction in the amounts of these porous insulating films. Moreover, in the case of electron beams, damages to transistors in the lowermost layer can be reduced with this configuration. The porous insulating films have low permittivity and therefore, it is possible to reduce parasitic capacities and to achieve high-speed signal propagation. For these reasons, the multilayer interconnection structure of the present invention is particularly suitable for highly-integrated semiconductor integrated circuits such as ICs and LSIs, which require high response speed.

Conventionally, it has been known that increased parasitic capacities in insulating films cause a reduction in the signal propagation speed. In a semiconductor device with an interconnection pitch of as large as 1 µm or more, however, interconnection delay has less effect on the whole of the semiconductor device. In recent years, interconnection width and interconnection pitch are becoming narrower and narrower along with increased packaging densities of semiconductor integrated circuits and with the advent of multilayer interconnection structures; in particular, the problem of increased interconnection resistance and increased parasitic capacities is prominent in semiconductor devices with an interconnection pitch of as small as 1 µm or less. Because both the interconnection resistance and parasitic capacities between interconnections—major factors that control the performance of devices such as semiconductor integrated circuits—determine the signal propagation speed in a multilayer interconnection structure of the semiconductor integrated circuits, the increased interconnection resistance and increased parasitic capacities are a big problem that needs to be overcome as the cause that reduces the signal propagation speed. For an increased signal propagation speed, it is necessary to reduce both the interconnection resistance and the parasitic capacities between interconnections (or the permittivities of the insulating films). Although the parasitic capacities between interconnections can be reduced by making the interconnections thin to reduce their cross-section areas, thin interconnections cause an increase in the interconnection resistance. This means that achieving an increased signal propagation speed is a trade-off between reduced parasitic capacities between interconnections and reduced interconnection resistance. At present, coating-type porous insulating films have been proposed as low permittivity-insulating films. Such insulating films, however, are poor in their mechanical strength because they are porous, thus requiring reinforcement. Examples of the methods for increasing the mechanical strength of such insulating films includes a method for curing an insulating film by applying exposure light (e.g., ultraviolet light) to it. The use of the exposure light-blocking film in such a method can reduce both the parasitic capacities between interconnections and interconnection resistance, making it possible to increase the signal propagation speed.

The method of the present invention for forming a multilayer interconnection structure is a method for forming the multilayer interconnection structure of the present invention, the method including at least an exposure light-blocking film formation step, a porous insulating film formation step, a curing step, and an interconnection formation step. In the exposure light-blocking film formation step an exposure light-blocking film is formed on a work surface by use of the material of the present invention for forming an exposure light-blocking film. In the porous insulating film formation step a porous insulating film is formed on the exposure light-blocking film. In the curing step the porous insulating film is cured by irradiation with exposure light. In the interconnection formation step an interconnection is formed. By repeating these steps, a multilayer interconnection structure is efficiently formed. The method for manufacturing a multilayer interconnection structure is particularly suitable for the manufacturing of the multilayer interconnection of the present invention.

The semiconductor device of the present invention includes at least the multilayer interconnection structure of the present invention. Since this semiconductor device includes the multilayer interconnection structure of the present invention, the parasitic capacities between interconnections and interconnection resistance can be reduced. For this reason, the semiconductor device of the present invention is particularly suitable for high-speed, highly-reliable flash memories, DRAMs, MOS transistors and so forth.

DESCRIPTION OF THE PREFERRED EMBODIMENTS

Figure 1:
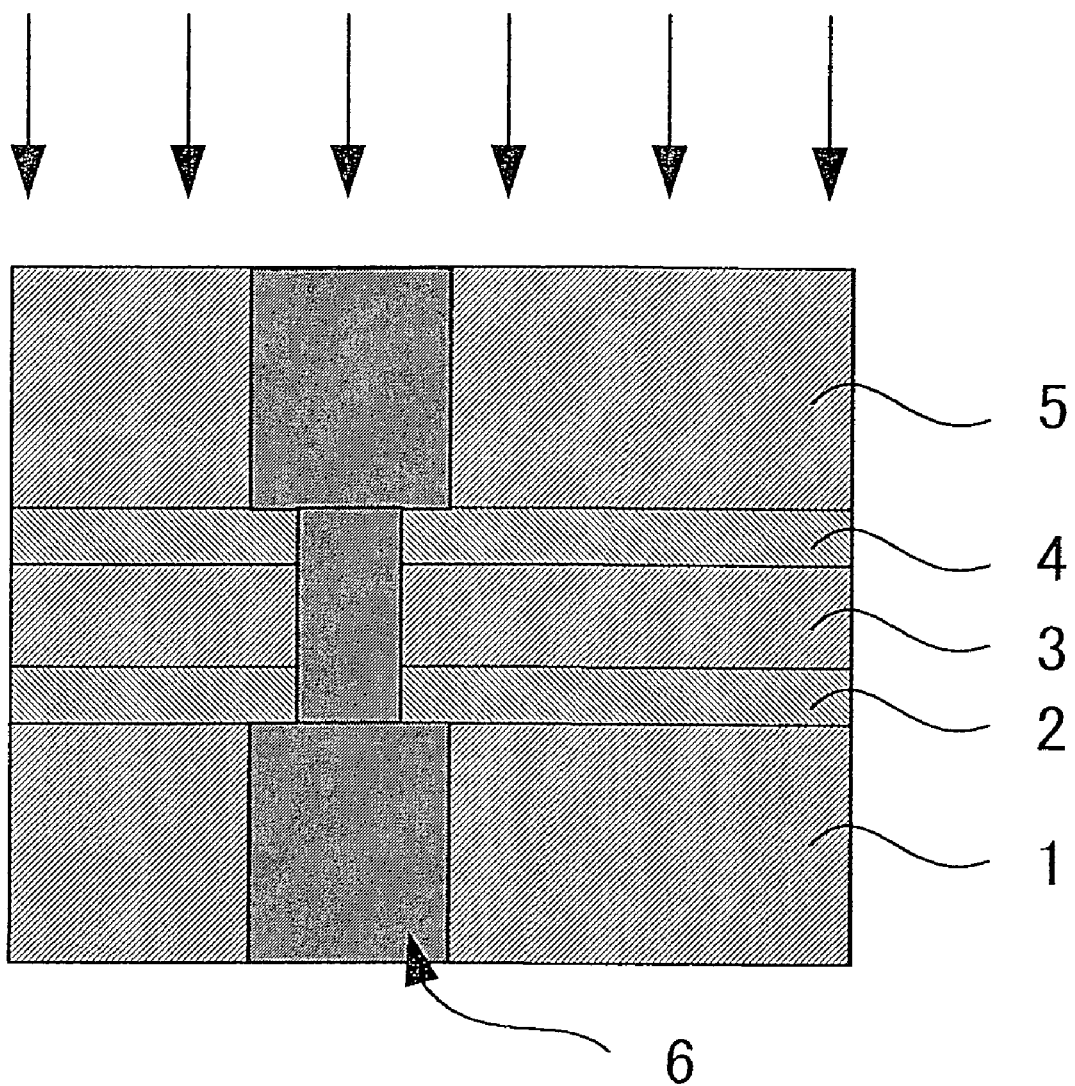
FIG. 1 is a process view for explaining a curing step in an example of a manufacturing method for a multilayer interconnection structure having an exposure light-blocking film formed of a material of the present invention for forming an exposure light-blocking film.

Material for Forming an Exposure Light-Blocking Film

The material of the present invention for forming an exposure light-blocking film includes at least one of a silicon compound expressed by the following structural formula (1) (hereinafter sometimes referred to as "polycarbosilane") and a silicon compound expressed by the following structural formula (2) (hereinafter sometimes referred to as "polysilazane"), and further includes an additional component on an as-needed basis, wherein a certain functional group of the polycarbosilane and polysilazane is replaced by a substituent capable of absorbing exposure light.

Structural Formula (1)

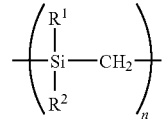

(where $R^1$ and $R^2$ may be the same or different, and each represents any one of a hydrogen atom, alkyl group, alkenyl group, cycloalkyl group and aryl group which are optionally substituted)

Here n is an integer of 2 or greater and represents the number of repeating units; it is preferably 10 to 1,000. If n is less than 10, it may result in poor coating properties of the foregoing material for forming an exposure light-blocking film. If n is greater than 1,000, it may result in variations in the thickness of the exposure light-blocking film to be formed.

Structural Formula (2)

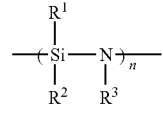

(where $R^1$, $R^2$ and $R^3$ may be the same or different, at least one of them represents a hydrogen atom and the others represent any one an alkyl group, alkenyl group, cycloalkyl group and aryl group which are optionally substituted)

Here, n is an integer of 2 or greater and represents the number of repeating units; n is preferably sufficient for a polysilazane expressed by the structural formula (2) to satisfy the following number-average molecular weight range.

The number-average molecular weight of the polysilazane is not particularly limited and can be appropriately determined depending on the intended purpose; it is preferably 100 to 50,000.

If the number-average molecular weight of the polysilazane is less than 100, it may result in poor coating properties of the foregoing material for forming an exposure light-blocking film. If the number-average molecular weight of the polysilazane is greater than 50,000, it may result in variations in the thickness of the exposure light-blocking film to be formed.

Both the polycarbosilane expressed by the structural formula (1) and the polysilazane expressed by the structural formula (2) require that at least one of $R^1$ and $R^2$ be replaced by a substituent capable of absorbing exposure light.

The method for replacing at least one of $R^1$ and $R^2$ in each of the polycarbosilane expressed by the structural formula (1) and the polysilazane expressed by the structural formula (2) by a substituent capable of absorbing exposure light is not particularly limited, and can be appropriately determined depending on the intended purpose. For example, this can be achieved by halogenating at least one of $R^1$ and $R^2$ and reacting it with Grignard reagent containing a substituent of interest.

The exposure light is not particularly limited and can be appropriately determined depending on the intended purpose; examples include ultraviolet light, plasmas, and electron beams. Among these, ultraviolet light is preferable in view of its suitability for the curing of porous insulating films.

When ultraviolet light is adopted as exposure light, it is possible to impart excellent ultraviolet light aborptivity to the foregoing material for forming an exposure light-blocking film, by replacing a certain functional group of the polycarbosilane and polysilazane by a substituent capable of absorbing ultraviolet light.

The substituent capable of absorbing ultraviolet light is not particularly limited and can be appropriately determined depending on the intended purpose; those containing at least one of a double bond, triple bond, and an aryl group which may contain a hetero atom are preferable. Specific suitable examples include a vinyl group, acroyl group, benzyl group, phenyl group, carbonyl group, carboxyl group, diazo group, azide group, cinnamoyl group, acrylate group, cinnamylidene group, cyanocinnamylidene group, furylpentadiene group and p-phenylenediacrylate group.

The method for determining the presence of a substituent capable of absorbing ultraviolet light—for example those containing at least one of a double bond, a triple bond and an aryl group which may contain a hetero atom—in the material for forming an exposure light-blocking film is not particularly limited, and can be appropriately determined depending on the intended purpose. For example, the presence of such substituents can be determined with the following methods: A method in which the structure of the substituent is analyzed by measuring its absorption peaks with infrared (IR) spectroscopy, or a method in which the identity, amount, and state of chemical bonds of a particular element is determined by XPS (X ray Photoelectron Spectroscopy) measurements.

The total content of the polycarbosilane expressed by the structural formula (1) and polysilazane expressed by the structural formula (2) in the material for an exposure light-blocking film is not particularly limited, even when used singly or in combination, and can be appropriately determined depending on the intended purpose; the content of them is preferably 30% by mass to 90% by mass, more preferably 40% by mass to 80% by mass of the total amount.

If the total content of these compounds is less than 30% by mass, the ability to block the exposure light may be reduced, permitting the light to reach lower layers. If the total content of these compounds is greater than 90% by mass, it may result in a significant increase in the permittivity of the exposure light-blocking film.

The additional component is not particularly limited as long as the effect of the present invention is not impaired, and can be appropriately determined depending on the intended purpose; examples include solvents, and various additives.

The solvents are not particularly limited and can be appropriately selected depending on the intended purpose; examples include cyclohexane, methyl isobutyl ketone, methyl ethyl ketone, methyl cellosolve, ethyl cellosolve, octane, decane, propylene glycol, propylene glycol monoethyl ether, and propylene glycol monoethyl ether acetate.

The content of the additional component in the material for forming an exposure light-blocking film can be determined according to the identities and contents of silicon compounds expressed by the structural formulae (1) and (2).

The material of the present invention for forming an exposure light-blocking film includes at least one of a silicon compound expressed by the structural formula (1) and a silicon compound expressed by the structural formula (2), and some of their functional groups are replaced by substituents capable of absorbing exposure light (e.g., ultraviolet light); therefore, it offers a high exposure light (e.g., ultraviolet light) absorptibity. It is thus possible to form an exposure light-blocking film with a function to block exposure light, which can be suitably used for the below-described multilayer interconnection structure and semiconductor device of the present invention.

(Exposure Light-Blocking Film)

The exposure light-blocking film of the present invention is formed by use of the material of the present invention for forming an exposure light-blocking film. Thus, it has an excellent function to block exposure light.

When a porous insulating film provided above an exposure light-blocking film is cured by irradiation with exposure light (e.g., ultraviolet light), the exposure light-blocking film efficiently prevents the exposure light from reaching other porous insulating films provided below the porous insulating film to be exposed (i.e., exposure target), reducing damage accumulation in these lower porous insulating films caused due to repeated curing operations and preventing the reduction in their thickness.

(Multilayer Interconnection Structure)

The multilayer interconnection structure of the present invention includes at least an exposure light-blocking film, a porous insulating film, and an interconnection layer, and further includes an appropriately selected additional member on an as-needed basis.

—Exposure Light-Blocking Film—

The exposure light-blocking film is formed by use of the material of the present invention for forming an exposure light-blocking film. Thus, it has an excellent function to block exposure light.

When a porous insulating film provided above an exposure light-blocking film is cured by irradiation with exposure light (e.g., ultraviolet light), the exposure light-blocking film efficiently prevents the exposure light from reaching other porous insulating films provided below the porous insulating film to be exposed (i.e., exposure target), reducing damage accumulation in these lower porous insulating films caused due to repeated curing operations and preventing the reduction in their thickness.

Note that the details of the above-described material for forming an exposure light-blocking film are identical to those given for the material of the present invention for forming an exposure light-blocking film.

The position where the exposure light-blocking film is provided is not particularly limited as long as it is provided below a porous insulating film to be irradiated with exposure light (i.e., exposure target), and can be appropriately determined depending on the intended purpose. The exposure light-blocking film may be in direct contact with the porous insulating film. Alternatively, another member may be provided between them. It is, however, preferable that the exposure light-blocking film be in direct contact with the porous insulating film for the purpose of preventing the exposure light from adversely affecting members other than the exposure target.

The thickness of the exposure light-blocking film is not particularly limited and can be appropriately determined depending on the intended purpose; the thickness of the exposure light-blocking film is preferably 5 nm to 70 nm, more preferably 5 nm to 50 nm.

If the thickness of the exposure light-blocking film is less than 5 nm, it sometimes fails to offer a function to block exposure light and porous insulating films arranged below the exposure light-blocking film may be damaged. If the thickness is greater than 70 nm, the net effective permittivity may be increased.

—Porous Insulating Film—

The porous insulating film is not particularly limited as long as it has pores therein; examples include porous silica films formed by spin coating, a carbon-doped $SiO_2$ film, a porous carbon-doped $SiO_2$ film obtained by adding a thermally decomposable compound to the carbon-doped $SiO_2$ film, and organic porous films. Among these porous films, porous silica films formed by spin coating are preferable.

The conditions under which spin coating is performed are as follows: Rotational speed is 100 rpm to 10,000 rpm, more preferably 800 rpm to 5,000 rpm; spin coating time is 1 second to 10 minutes, more preferably 10 to 90 seconds.

The constituent material, structure, thickness, permittivity and the like of the porous insulating film are not particularly limited and can be appropriately determined depending on the intended purpose.

When the porous silica film is used as the porous insulating film, examples of the constituent materials of such a porous silica film include polymers that resulted from hydrolysis and condensation polymerization reactions, such as tetraalkoxysilane, trialkoxysilane, methyltrialkoxysilane, ethyltrialkoxysilane, propyltrialkoxysilane, phenyltrialkoxysilane, vinyltrialkoxysilane, allyltrialkoxysilane, glycidyltrialkoxysilane, dialkoxysilan, dimethyldialkoxysilane, diethyldialkoxysilane, dipropyldialkoxysilane, diphenyldialkoxysilane, divinyldialkoxysilane, diallyldialkoxysilane, diglycidyldialkoxysilane, phenylmethyldialkoxysilane, phenylethyldialkoxysilane, phenylpropyltrialkoxysilane, phenylvinyldialkoxysilane, phenylallyldialkoxysilane, phenylglycidyldialkoxysilane, methylvinyldialkoxysilane, ethylvinyldialkoxysilane, and propylvinyldialkoxysilane. These polymers may be used singly or in combination. It is possible to obtain porous insulating films with fine pores by adding a thermally decomposable compound or the like to these polymers and heating them.

The thermally decomposable compound is not particularly limited and can be appropriately selected depending on the intended purpose; acrylic resins are examples.

When a carbon-doped $SiO_2$ film is used as the porous insulating film, the constituent material thereof is not particularly limited and can be appropriately determined depending on the intended purpose; suitable examples include carbon dioxide, and alkyl group-containing siloxane monomers such as hexamethyldisiloxane.

When a porous carbon-doped $SiO_2$ film is used as the porous insulating film, the constituent material thereof is not particularly limited and can be appropriately selected depending on the intended purpose; suitable examples include carbon dioxide, thermally decomposable atom groups (thermally decomposable compounds), and oxidatively decomposable atom groups (oxidatively decomposable compounds). More specifically, alkyl group-containing siloxane monomers such as hexamethyldisiloxane, and phenyl group-containing silane compounds such as diphenylmethylsilane are suitable examples.

When an organic porous film is used as the porous insulating film, the constituent material thereof is not particularly limited and can be appropriately selected depending on the intended purpose; examples include polymers containing a thermally decomposable organic compound.

The thermally decomposable organic compound is not particularly limited and can be appropriately selected depending on the intended purpose. However, thermally decomposable organic compounds that are thermally decomposed at 200° C. to 300° C. are preferable; examples include acrylic resins, polyethylene resins, polypropylene resins, acrylic oligomers, ethylene oligomers, and propylene oligomers. A polyarylether polymer containing such a thermally decomposable organic compound is diluted with a solvent, and the resultant solution is used. In this case, cyclohexanone can be used for the solvent, for example.

Suitable examples of the constituent materials of the porous insulating film include a clustered porous silica precursor formed under the presence of a quaternary alkylamine as a catalyst. In this case, a porous insulating film with small, uniform pores can be obtained.

The porous silica precursor may be a commercially available one or may be freshly synthesized where appropriate. Nano-clustering silica (NCS) (Celamate NSC, produced by Catalysts & Chemicals Industries Co., LTD.), is a suitable example of a commercially available porous silica precursor.

The structure of the porous insulating film is not particularly limited and can be appropriately determined depending on the intended purpose; the porous insulating film may have either a single-layer structure or a laminated (multilayer) structure.

The thickness of the porous insulating film is not particularly limited and can be appropriately determined depending on the intended purpose; the thickness of the porous insulating film is generally 10 nm to 1 μm, preferably 10 nm to 500 nm, more preferably 10 nm to 300 nm in a multilayer interconnection structure.

If the thickness of the porous insulating film is less than 10 nm, it may result in structural defects such as pin holes. If the thickness of the porous insulating film is greater than 500 nm, it is sometimes difficult to ensure a proper etch selectivity of resist to the porous insulating film, particularly at the time of dry etching processing.

The permittivity of the porous insulating film is not particularly limited and can be appropriately determined depending on the intended purpose; the lower the permittivity, the more preferable. More specifically, the permittivity of the porous insulating film is preferably 3.0 or less, more preferably 2.8 or less.

The permittivity of the porous insulating film can be measured in the following manner, for example: A gold electrode is formed on the porous insulating, and the permittivity is measured through the gold electrode using a permittivity measurement device or the like.

—Interconnection Layer—

The constituent material, structure, shape, thickness and the like of the interconnection layer are not particularly limited and can be appropriately determined depending on the intended purpose. However, the interconnection layer preferably has a multilayer (laminated) structure for the purpose of increasing the scale of integration of circuits.

—Additional Member—

The additional member is not particularly limited and can be appropriately determined depending on the intended purpose. A suitable example is an interlayer insulating film other than the exposure light-blocking film and the porous insulating film, which can admit exposure light such as ultraviolet light.

The interlayer insulating film is not particularly limited and can be appropriately determined depending on the intended purpose. Examples include stopper films. More specifically, examples include a carbon-doped $SiO_2$ film, SiC:H film, SiC:N film, SiC:O:H film and $SiO_2$ film which are formed by plasma CVD, and an organic SOG and inorganic SOG which are formed by spin coating. When the porous insulating film is formed by spin coating, an organic SOG and an inorganic SOG are preferable. In this case, the formation step and ultraviolet curing step for the porous insulating film and the interlayer insulating film can be performed at the same time, thereby achieving simplification of the manufacturing process.

The constituent material, shape, structure, thickness, density and the like of the interlayer insulating film are not particularly limited and can be appropriately determined depending on the intended purpose; the interlayer insulating film is preferably 5 nm to 300 nm in thickness, more preferably 5 nm to 180 nm in thickness.

If the thickness of the interlayer insulating film is less than 5 nm, the interlayer insulating film may be severely damaged by the exposure light. If the thickness of the interlayer insulating film is greater than 300 nm, the degree of progress of curing may differ between the upper and lower sides of the film.

In addition, the density of the interlayer insulating film is preferably 1 $g/cm^3$ to 3 $g/cm^3$, more preferably 1 $g/cm^3$ to 2.5 $g/cm^3$.

If the density of the interlayer insulating film is less than 1 $g/cm^3$, the film strength may be significantly reduced. If the density of the interlayer insulating film is greater than 3 $g/cm^3$, it may difficult to keep the permittivity of the interlayer insulating film low.

Since the multilayer interconnection structure of the present invention includes the exposure light-blocking film formed of the material of the present invention for forming an exposure light-blocking film, it is possible to efficiently prevent the exposure light (e.g., ultraviolet light) from reaching the porous insulating film to reduce curing damage accumulation, and to prevent a film amount reduction. In addition, the porous insulating film has a low permittivity and thus the parasitic capacity can be reduced and the signal propagation speed can also be increased. For these reasons, the multilayer interconnection structure of the present invention is suitable for highly-integrated semiconductor integrated circuits such as ICs and LSIs, which require a high response speed.

(The Method for Manufacturing a Multilayer Interconnection Structure)

The method of the present invention for manufacturing a multilayer interconnection structure includes at least an exposure light-blocking film formation step, a porous insulating film formation step, curing step, and an interconnection layer formation step. The method preferably includes an interlayer insulating film formation step, a heat treatment step and the like, and further includes an additional step on an as-needed basis.

<Exposure Light-Blocking Film Formation Step>

The exposure light-blocking film formation step is one in which an exposure light-blocking film is formed on a work surface by use of the material of the present invention for forming an exposure light-blocking film.

Note that the details of the material of the present invention for forming an exposure light-blocking film are identical to those given above.

The work surface is not particularly limited and can be appropriately determined depending on the intended purpose. For example, when the multilayer interconnection structure is to be used in a semiconductor device, the surface of its semiconductor substrate is an example. More specifically, the surfaces of substrates (e.g., silicon wafers), oxide films, and low-permittivity films (e.g., porous insulating films) are suitable examples.

The method for forming the exposure light-blocking film is not particularly limited and can be appropriately determined depending on the intended purpose. For example, coating is a suitable example.

The method applied in such a coating process is not particularly limited and can be appropriately determined depending on the intended purpose. Examples include spin coating, dip coating, kneader coating, curtain coating, and blade coating. Among these, spin coating is preferable in view of, for example, its coating efficiency. The conditions under which spin coating is performed are as follows: Rotational speed is 100 rpm to 10,000 rpm, more preferably 800 rpm to 5,000 rpm; spin coating time is 1 second to 10 minutes, more preferably 10 to 90 seconds.

In this way the exposure light-blocking film is formed on the work surface by use of the material of the present invention for forming an exposure light-blocking film.

<Porous Insulating Film Formation Step>

The porous insulating film formation step is one in which a porous insulating film is formed on the exposure light-blocking film formed in the foregoing exposure light-blocking film formation step.

The method for forming the porous insulating film is not particularly limited and can be appropriately determined depending on the intended purpose. For example, the following method can be used according to the type of the porous insulating film to be formed.

At first, as the material for the porous insulating film, a polymer capable of forming the foregoing porous silica film and a thermally decomposable compound are applied onto the exposure light-blocking film and are then subjected to a heat treatment (soft baking), whereby the thermally decomposable compound is thermally decomposed to form pores (fine pores) in the resultant film, leading to the formation of the porous insulating film.

Note that this coating process is similar to that adopted in the foregoing exposure light-blocking film formation step.

The method used for the heat treatment (soft baking) is not particularly limited and can be appropriately determined depending on the intended purpose. For example, these materials are preferably baked on a hot plate. By this, the thermally decomposable compound is thermally decomposed to form pores (fine pores) of 10 nm to 20 nm in diameter in the resultant insulating film.

The conditions under which the heat treatment is performed (e.g., temperature and atmosphere) can be determined depending on the intended purpose. However, the heat treatment temperature is preferably 200° C. to 350° C.

If the heat treatment temperature is below 200° C., the thermally decomposable compound is not fully decomposed, it may result in a reduction in the number of pores to be formed, and the rate at which the thermally decomposable compound is decomposed may be so low that it may take long time to complete the formation of pores. If the heat treatment temperature is greater than 350° C., the porous insulating film material is cured very rapidly, inhibiting the formation of pores in some cases.

An additional example of the method for forming the porous insulating film is a carbon-doped $SiO_2$ film formation method that uses a vapor growth method.

This can be achieved by the use of a parallel-plate CVD device, for example. At first, the temperature of a substrate on which the porous insulating film is to be formed is set to, for example, 300° C. to 400° C. An alkyl group-containing siloxane monomer is then vaporized using a vaporizing device to produce reactive gas. The reactive gas is introduced into a chamber using a carrier gas. The application of high-frequency power between plate electrodes at this point generates plasma from the reactive gas. Here, setting the deposition rate to a relatively high level leads to the formation of the porous insulating film. More specifically, the porous insulating film can be suitably produced under the following deposition conditions: Hexamethyldicycloxane is used as the reactive gas and supplied at a rate of 3 mg/min; $CO_2$ is used as the carrier gas and supplied at a flow rate of 6,000 sccm; and the level of the high-frequency power applied between the plate electrodes is set to, for example, 13.56 MHz (500 W) or 100 kHz (500 W). A porous insulating film formed of a carbon-containing silicon oxide film can be produced under these conditions.

An additional example of the method for forming the porous insulating film is a porous carbon-doped $SiO_2$ film formation method, where either thermally decomposable atom groups (a thermally decomposable compound) or oxidatively decomposable atom groups (an oxidatively decomposable compound) are decomposed by plasma, forming a porous carbon-doped $SiO_2$ film with a vapor growth method.

This can be achieved by the use of a parallel-plate CVD device, for example. At first, the temperature of a substrate on which the porous insulating film is to be formed is set to, for example, 250° C. to 300° C. An alkyl group-containing siloxane monomer is then vaporized using a vaporizing device to produce first reactive gas, and a phenyl group-containing silane compound is similarly vaporized to produce second reactive gas. Notice here that the phenyl group is an atom group (thermally decomposable and oxidatively decomposable atom group) that is upon heating decomposed by the oxidation reaction.

The first and second reactive gases are then introduced into a chamber using carrier gas. The application of high-frequency power between plate electrodes at this point transforms the $CO_2$ gas into plasma (oxygen plasma), decomposing phenyl groups. While the phenyl groups are being decomposed, the gases are deposited on the substrate to form a porous insulating film. More specifically, for example, the porous insulating film can be suitably produced under the following deposition conditions: Hexamethyldicycloxane is used as the first reactive gas and supplied at a rate of 1 mg/min; diphenylmethylsilane is used as the second reactive gas and supplied at a rate of 1 mg/min; $CO_2$ is used as the carrier gas and supplied at a flow rate of 3,000 sccm; and the level of the high-frequency power applied between the plate electrodes is set to, for example, 13.56 MHz (300 W) or 100 kHz (300 W). A porous insulating film formed of a carbon-containing silicon oxide film can be produced under these conditions.

In stead of using materials containing thermally and oxidatively decomposable atom groups that are decomposed by oxidation under heat, materials containing thermally decomposable atom groups that can be thermally decomposed without the help of oxidation, and materials containing oxidatively decomposable atom groups that can be oxidatively decomposed without the help of heat can also be used.

An additional example of the method for forming the porous insulating film is one in which a polymer containing the thermally decomposable compound is diluted with a solvent, and the resultant solution is applied on the exposure light-blocking film to form an organic porous film.

More specifically, a polymer containing the thermally decomposable compound is diluted with a solvent, and the resultant solution is applied on the exposure light-blocking film followed by a hot plate heat treatment at 100° C. to 400° C., whereby the solvent in the resultant insulating film is evaporated, drying the insulating film. Subsequently, the insulating film is subjected to an additional heat treatment at 300° C. to 400° C. to decompose the thermally decomposable compound, forming pores in the insulating film. In this way an organic porous insulating film is formed.

An additional example of the method for forming the porous insulating film is one in which the silica cluster precursor, the porous insulating film material, is applied onto the exposure light-blocking film, and is subjected to a heat treatment for the formation of a porous insulating film.

More specifically, after applying the silica cluster precursor onto the exposure light-blocking film by spin coating, the silica cluster precursor is subjected to a hot plate heat treatment (soft baking). Here, the heat treatment temperature is, for example, about 200° C. and the heat treatment time is about 150 seconds. The solvent in the resultant insulating film is evaporated, forming a porous insulating film. The use of a clustered silica for the formation of the insulating film leads to a highly excellent porous insulating film with a very uniform pore distribution.

In this way a porous insulating film is formed on the exposure light-blocking film formed in the exposure light-blocking film formation step.

<Curing Step>

The curing step is one in which a porous insulating film formed in the porous insulating film formation step is cured by irradiation with exposure light.

The curing method used in the curing step is not particularly limited as long as the porous insulating film is irradiated with exposure light, and can be appropriately determined depending on the intended purpose. For example, ultraviolet light is a suitable example of the exposure light.

The wavelength of ultraviolet light is not particularly limited and can be appropriately determined depending on the intended purpose. The wavelength of ultraviolet light is preferably 230 nm to 380 nm.

If the wavelength of ultraviolet light is less than 230 nm, the irradiation energy is so high that methyl groups in the porous insulating film may be cleaved off, causing an increase in the permittivity. If the wavelength of ultraviolet light is greater than 380 nm, the irradiation energy is so low that film curing may not proceed.

The application of ultraviolet light can be performed using an ultraviolet lamp. Examples of such an ultraviolet lamp include a high-pressure mercury lamp.

The conditions under which ultraviolet light is applied (e.g., atmosphere) can be appropriately determined depending on the intended purpose. For example, the application of ultraviolet light is preferably performed under the presence of inert gas such as argon gas or nitrogen gas. Alternatively, the application of ultraviolet light may be performed under vacuum or normal pressure, however, it is preferably performed under vacuum because the generation of ozone can be prevented.

In the curing step it is preferable that the application of ultraviolet light be performed along with a heat treatment. This is advantageous because curing of the porous insulating film is facilitated and thus the mechanical strength of the film can be increased.

The heat treatment temperature is not particularly limited and can be appropriately determined depending on the intended purpose. For example, the heat treatment temperature is preferably 50° C. to 470° C., more preferably 50° C. to 450° C.

The application of the exposure light (e.g., ultraviolet light) is preferably performed at one (particular) temperature or at different temperatures by appropriately changing the temperature within this heat treatment temperature range. In this case, curing of the porous insulating film is facilitated, making it possible to increase both its film strength and the adhesion between the porous insulating film and a lower insulating film (e.g., the exposure light-blocking film).

After forming an interlayer insulating film on the porous insulating film in the interlayer insulating film formation step to be described later, it is preferable in the curing step that the porous insulating film be cured by irradiation with the exposure light through the interlayer insulating film disposed on it. In this case, since the interlayer insulating film can admit the exposure light, both the interlayer insulating film and the porous insulating film can be cured at the same time. Thus, it is possible to simplify the manufacturing process.

In this way the porous insulating film is cured by irradiation with exposure light (e.g., ultraviolet light).

Hereinafter, an example of the curing step, where ultraviolet light is adopted as the exposure light, will be described with reference to the drawings.

FIG. 1 illustrates a layer structure where a copper interconnection 6 and alternating layers of porous insulating films 1, 3 and 5 and exposure light-blocking films 2 and 4 and are formed, showing an example of the curing step state where the uppermost porous insulating film 5 is irradiated with ultraviolet light.

In the curing step an ultraviolet light exposure target 5 (the porous insulating film to be irradiated with ultraviolet light) is irradiated with ultraviolet light for curing. At this point, the exposure light-blocking film 4, which is formed of the material of the present invention for forming an exposure light-blocking film and is provided below the exposure target 5, absorbs ultraviolet light, thereby preventing the ultraviolet light from reaching the porous insulating film 3 provided below the exposure target 5. In addition, the exposure light-blocking film 2 provided below the exposure light-blocking film 4 and porous insulating film 3 also prevents the ultraviolet film from reaching the porous insulating film 1. It is therefore possible to efficiently prevent the reduction in the thickness of the porous insulating films provided below the exposure target 5 and the increase in the parasitic capacity between adjacent interconnections, which are caused due to the curing operation for the exposure target 5. Thus, it is possible to provide a multilayer interconnection structure of high-performance and high-reliability.

<Interconnection Formation Step>

The interconnection formation step is one in which interconnections are formed.

For the formation of the multilayer interconnection structure, the interconnection formation step preferably includes appropriately selected additional steps, such as a through via formation step and a conductor plating step.

—Through Via Formation Step—

The through via formation step is one in which though vias are formed that are connected to the interconnections formed in the uppermost layer of the porous insulating film formed on the work surface.

The though vias can be formed by applying laser light of suitable exposure level to portions where they are to be formed, for example.

The laser light is not particularly limited and can be appropriately determined depending on the intended purpose. Examples include $CO_2$ laser, excimer laser, and YAG laser.

—Conductor Plating Step—

The conductor plating step is one in which a conductor, an interconnection precursor, is applied on the entire surface of the porous insulating film formed on the work surface to form a conductor plating layer.

For example, typical plating methods such as electroless plating and electroplating can be used for conductor plating.

The formation of the interconnections can be achieved by etching the conductor plating layer, which has been formed in the conductor plating step, to produce a desired interconnection pattern.

The etching method is not particularly limited and can be appropriately selected from typical etching methods according to the intended purpose.

In this way the interconnections are formed.

A series of the exposure light-blocking film formation step, porous insulating film formation step, curing step, and interconnection formation step (including the through via formation step and conductor plating step) is conduced (or repeated as needed). Thus, a multilayer interconnection structure with highly integrated circuits is formed.

<Interlayer Insulating Film Formation Step>

The interlayer insulating film formation step is one in which an interlayer insulating film capable of admitting ultraviolet light is formed on the porous insulating film after the porous insulating film formation step.

Note that the details of the interlayer insulating film are identical to those given in the description of the multilayer interconnection structure of the present invention. For example, examples of the interlayer insulating film include a carbon-doped $SiO_2$ film, SiC:H film, SiC:N film, SiC:O:H film and $SiO_2$ film which are formed by plasma CVD, and an organic SOG and inorganic SOG which are formed by spin coating.

The constituent material, shape, structure, thickness, density and the like of the interlayer insulating film are not particularly limited and can be appropriately determined depending on the intended purpose; the interlayer insulating film is preferably 5 nm to 300 nm in thickness, more preferably 5 nm to 180 nm in thickness.

If the thickness of the interlayer insulating film is less than 5 nm, the interlayer insulating film may be severely damaged by the exposure light. If the thickness of the interlayer insulating film is greater than 300 nm, the degree of curing may differ between the upper and lower sides of the film.

In addition, the density of the interlayer insulating film is preferably 1 g/cm$^3$ to 3 g/cm$^3$, more preferably 1 g/cm$^3$ to 2.5 g/cm$^3$.

If the density of the interlayer insulating film is less than 1 g/cm$^3$, the film strength may be significantly reduced. If the density of the interlayer insulating film is greater than 3 g/cm$^3$, it may difficult to keep the permittivity of the interlayer insulating film low.

<Heat Treatment Step>

Upon lamination of the exposure light-blocking film, porous insulating film and interlayer insulating film in this order using the method of the present invention for forming a multilayer interconnection structure, each film formed through a coating process is preferably subjected to a heat treatment before being laminated on top of each other. With this configuration it is possible to increase the strength of these films.

The method used for the heating treatment is not particularly limited and can be appropriately determined depending on the intended purpose; soft baking is preferable, and the soft baking temperature is preferably 80° C. to 380° C.

It is preferable that the heating treatment be performed so that each film has a crosslinking ratio of 10% to 90% as determined with infrared (IR) spectroscopy.

The adhesion of each film with adjacent films can be increased if their crosslinking ratio falls within the foregoing range. If the crosslinking ratio is less than 10%, a coating solvent may dissolve lower films. If the crosslinking ratio is greater than 90%, it may difficult to keep the permittivity of the interlayer insulating film low.

The method of the present invention for manufacturing a multilayer interconnection structure can be suitably used in various fields. In particular, this method can be suitably used for the manufacturing of the multilayer interconnection structure of the present invention.

Since the multilayer interconnection structure of the present invention includes an exposure light-blocking film formed of the material of the present invention for forming an exposure light-blocking film—a material which has an excellent ultraviolet light absorptivity—it is possible to efficiently prevent exposure light (e.g., ultraviolet light) from reaching porous insulating films provided below an exposure target (i.e., a porous insulating film to be exposed) upon curing of the exposure target, and to prevent a film amount reduction. In addition, the porous insulating film has a low permittivity and thus the parasitic capacity can be reduced and the signal propagation speed can be increased. For these reasons, the multilayer interconnection structure of the present invention is particularly suitable for highly-integrated semiconductor integrated circuits such as ICs and LSIs which require high response speed, particularly for the semiconductor device of the present invention.

(Semiconductor Device)

The semiconductor device of the present invention includes at least the multilayer interconnection structure of the present invention, and further includes an additional member on an as-needed basis which has been appropriately selected.

The semiconductor device is not particularly limited as long as it includes the multilayer interconnection structure having at least the exposure light-blocking film, the porous insulating film and the interconnection layer, and can be appropriately determined depending on the intended purpose.

The additional member is not particularly limited and can be appropriately selected depending on the intended purpose. Examples include general components in a semiconductor device, such as a gate electrode, a drain electrode, and a source electrode.

The method for manufacturing the semiconductor device of the present invention is not particularly limited and can be appropriately determined depending on the intended purpose; the method of the present invention for manufacturing a semiconductor device, which will be described later, is preferable.

The semiconductor device of the present invention includes at least the multilayer interconnection structure of the present invention having an exposure light-blocking film formed of the material of the present invention for forming an exposure light-blocking film. In the multilayer interconnection structure of the present invention, the exposure light-blocking film efficiently prevents exposure light (e.g., ultraviolet light) from reaching the porous insulating film provided below the exposure light-blocking film, preventing the film amount reduction and the like. In addition, the porous insulating film has a low permittivity and thus both the parasitic capacity between adjacent interconnections and the interconnection resistance can be reduced. Thus, it is possible to provide a high-speed, highly reliable semiconductor device.

The semiconductor device of the present invention is particularly suitable, for example, for flash memories, DRAMs, FRAMs, and MOS transistors.

(Method for Manufacturing a Semiconductor Device)

The method of the present invention for manufacturing a semiconductor includes at least a multilayer interconnection structure formation step, and further includes an additional step on an as-needed basis which has been appropriately selected.

The multilayer interconnection structure formation step is one in which a multilayer interconnection structure is formed on a work surface by means of the method of the present invention for forming a multilayer interconnection.

The details of the work surface and the manufacturing method for the multilayer interconnection structure are identical to those given in the foregoing description of the multilayer interconnection structure of the present invention.

The additional step is not particularly limited and can be appropriately determined depending on the intended on the intended purpose. Examples include various steps used in a general semiconductor manufacturing method, such as a gate electrode formation step, a drain electrode formation step, and a source electrode formation step.

With the method of the present invention for manufacturing a semiconductor device, both the parasitic capacity between adjacent interconnections and the interconnection resistance can be reduced, and thus it is possible to manufacture the high-speed, highly reliable semiconductor device of the present invention efficiently.

Hereinafter, the present invention will be described with reference to Examples, which however shall not be construed as limiting the invention thereto.

Example 1

Preparation of Material for Forming an Exposure Light-Blocking Film

At least one of $R^1$ and $R^2$ in a polycarbosilane expressed by the structural formula (1) was halogenated and reacted with Grignard reagent containing a vinyl group—a substituent capable of absorbing ultraviolet light. In this way a material for forming an exposure light-blocking film, which contains a polycarbosilane expressed by the structural formula (1) where at least one of $R^1$ and $R^2$ is replaced by a vinyl group was prepared.

—Manufacturing of the Multilayer Interconnection Structure and Semiconductor Device—

Figure 2A:
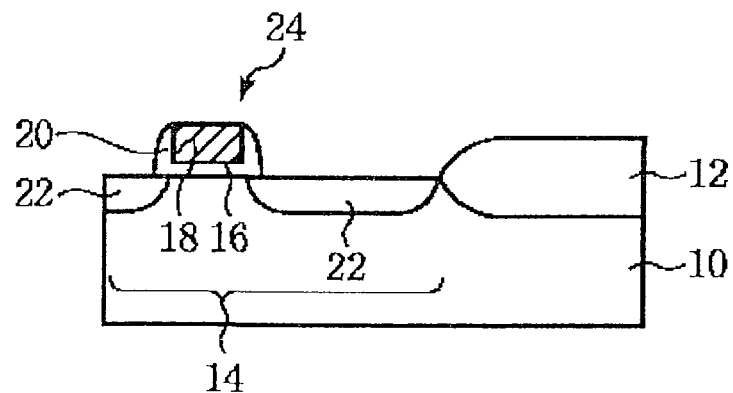
FIG. 2A is a first process view of an example of a method for manufacturing the semiconductor device of the present invention which has an exposure light-blocking film formed of the material of the present invention for forming an exposure light-blocking film.

Both the multilayer interconnection structure and semiconductor device of the present invention were manufactured in the manner described below. At first, as shown in FIG. 2A, an element separation film 12 was formed on a semiconductor substrate 10 with a LOCOS (Local Oxidation of Silicon) method. The element separation film 12 defined an element region 14. Note that a silicon substrate was adopted for the semiconductor substrate 10.

Next, a gate electrode 18 was formed on the element region 14, with a gate insulating film 16 interposed between them, and a side wall insulating film 20 was formed on the side surface of the gate electrode 18. Moreover, using both the side wall insulating 20 and the gate electrode 18 as masks, dopant impurities were introduced into the semiconductor substrate 10 to form a source/drain diffusion layer 22 at both sides of the gate electrode 18 in the semiconductor substrate 10. In this way a transistor 24 having both the gate electrode 18 and the source/drain diffusion layer 22 was formed.

Figure 2B:
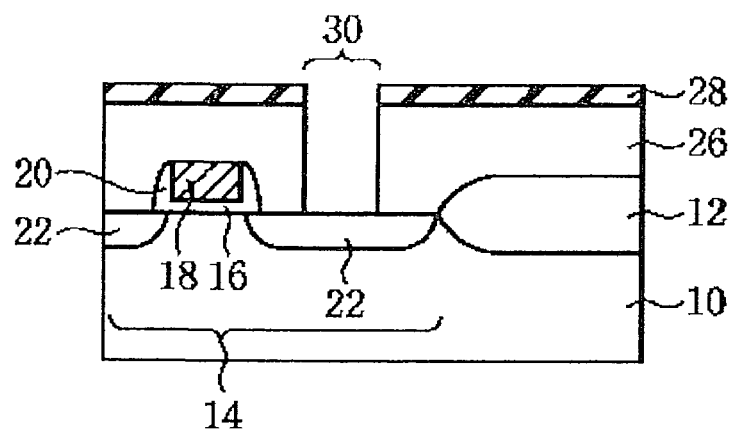
FIG. 2B is a second process view of the example of a method for manufacturing the semiconductor device of the present invention which has an exposure light-blocking film formed of the material of the present invention for forming an exposure light-blocking film.

As shown in FIG. 2B, an interlayer insulating film 26 formed of a silicon oxide film was formed by CVD on the entire surface of the semiconductor substrate 10 where the transistor 24 is formed. A stopper film 28 formed of a SiN film of 50 nm thickness, produced by plasma CVD, was then formed on the interlayer insulating film 26. Note that in the steps to be described later the stopper film 28 serves as a stopper when a tungsten film 34 or the like is polished by CMP (Chemical Mechanical Polishing) (see FIG. 2C), and as an etching stopper when a trench 46 is formed in a porous insulating film 38 or the like (see FIG. 2F). Subsequently, a contact hole 30 that reaches the source/drain diffusion layer 22 was formed using photolithography.

Figure 2C:
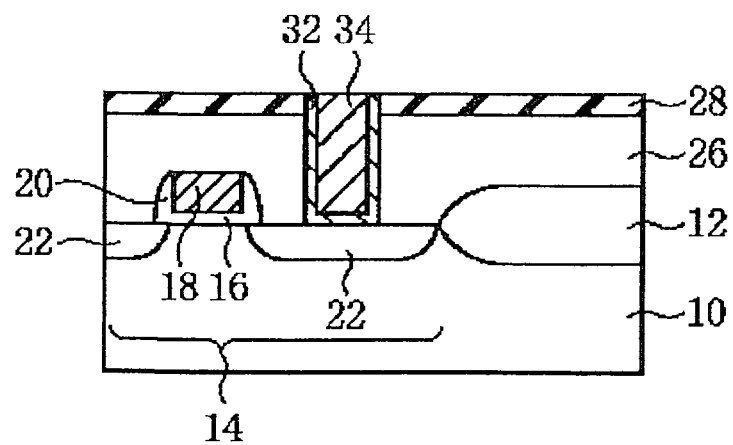
FIG. 2C is a third process view of the example of a method for manufacturing the semiconductor device of the present invention which has an exposure light-blocking film formed of the material of the present invention for forming an exposure light-blocking film.

Next, an adhesion layer 32 formed of a TiN film of 50 nm thickness was formed on the entire surface of the interlayer insulating film 26 by sputtering. Note that the adhesion layer 32 can provide adhesion between a conductor plug 34 to be described later and the base. The tungsten film 34 of 1 µm thickness was then formed on the entire surface of the adhesion layer 32 by CVD, and both the tungsten is film 34 and the adhesion layer 32 were polished by CMP (Chemical Mechanical Polishing), until the time when the surface of the stopper film 28 was exposed. In this way, as shown in FIG. 2C, the conductor plug 34 made of tungsten was embedded in the contact hole 30.

Figure 2D:
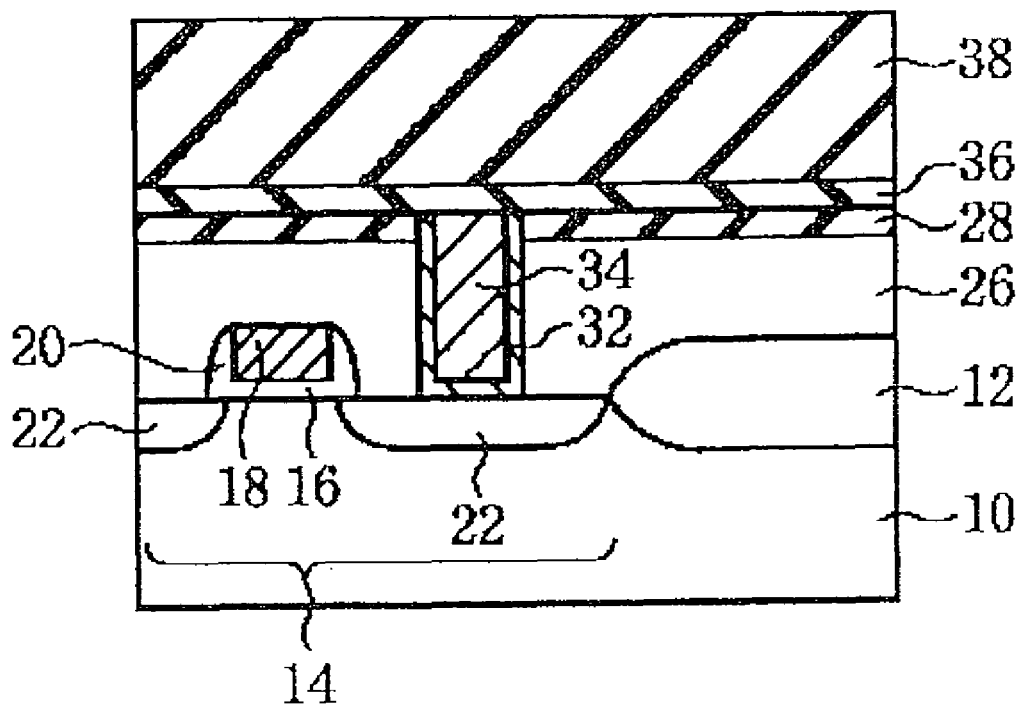
FIG. 2D is a fourth process view of the example of a method for manufacturing the semiconductor device of the present invention which has an exposure light-blocking film formed of the material of the present invention for forming an exposure light-blocking film.

As shown in FIG. 2D, an exposure light-blocking film (first interlayer insulating film) 36 of 30 nm thickness was formed on the entire surface of the stopper film 28 by use of the foregoing material for forming an exposure light-blocking film. The measurement of the absorption peaks of the exposure light-blocking film 36 with infrared (IR) spectroscopy revealed the presence of double bonds.

Subsequently, a porous insulating film (second interlayer insulating film) 38 made of porous silica was formed on the entire surface of the exposure light-blocking film 36 to a thickness of 160 nm. The porous insulating film 38 was cured by irradiation with ultraviolet light.

Figure 2E:
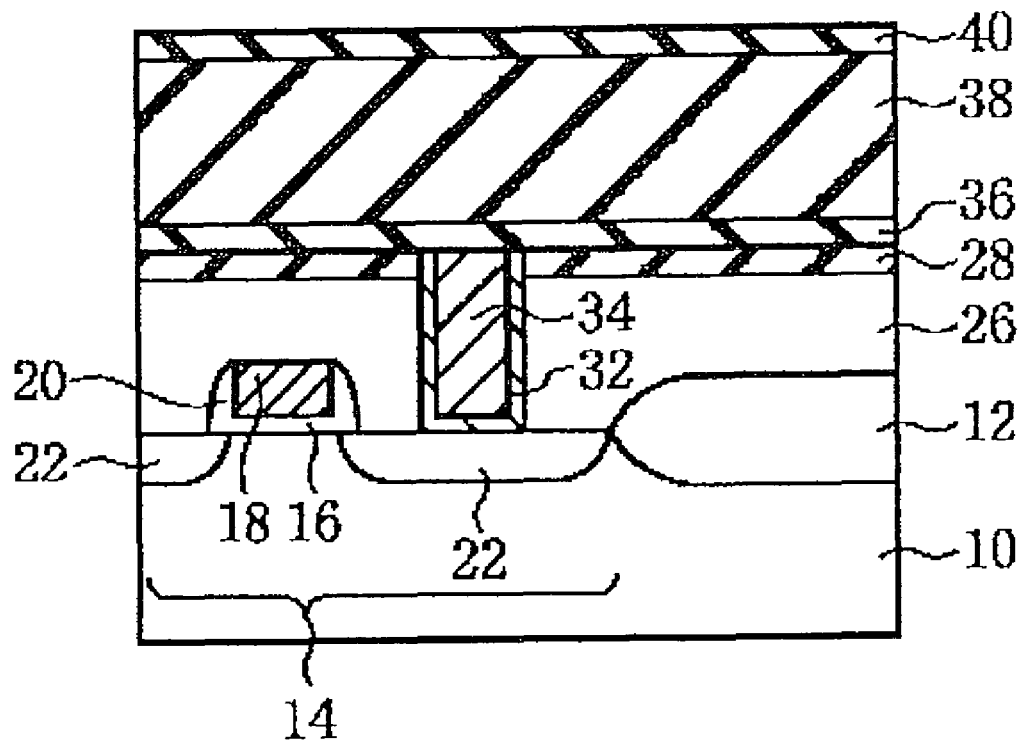
FIG. 2E is a fifth process view of the example of a method for manufacturing the semiconductor device of the present invention which has an exposure light-blocking film formed of the material of the present invention for forming an exposure light-blocking film.

As shown in FIG. 2E, using the foregoing material for forming an exposure light-blocking film, an exposure light-blocking film 40 was then formed on the entire surface of the porous insulating film 38 to a thickness of 30 nm.

Figure 2F:
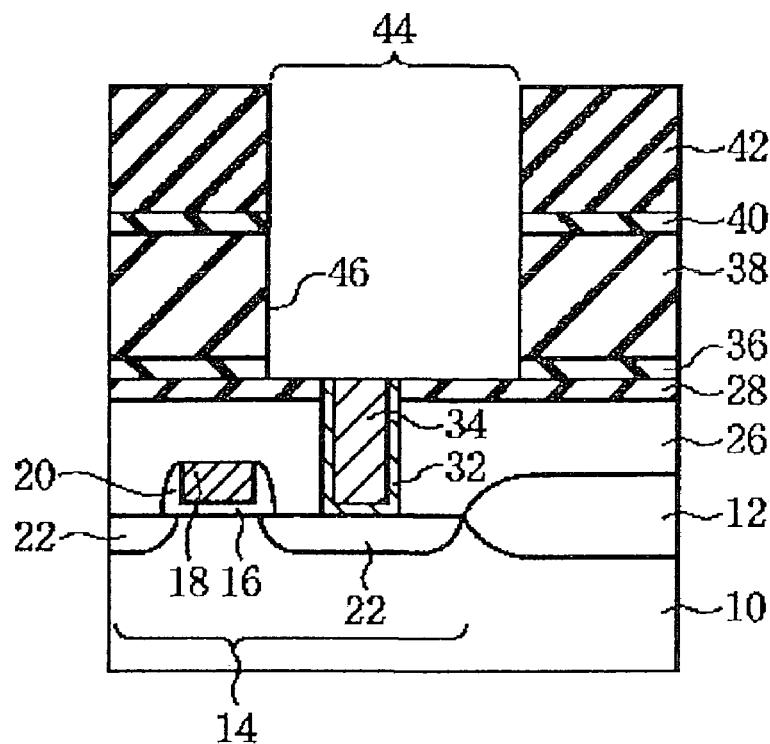
FIG. 2F is a sixth process view of the example of a method for manufacturing the semiconductor device of the present invention which has an exposure light-blocking film formed of the material of the present invention for forming an exposure light-blocking film.

Next, as shown in FIG. 2F, a photoresist film 42 was formed on the entire surface of the exposure light-blocking film 40 by spin coating. An opening 44 was then formed in the photoresist film 42 using photolithography. Here, in the opening 44a first interconnection (first metal interconnection layer, see FIG. 2G) 50 is provided, and the dimension of the opening 44 is such that both the interconnection width and interconnection pitch are 100 nm.

Using the photoresist film 42 as a mask, the exposure light-blocking films 36 and 40 and porous insulating film 38 were subjected to an etching treatment, where fluorine plasma derived from $CF_4$ gas and $CHF_3$ gas was used. At this point, the stopper film 28 served as an etching stopper. In this way the trench 46 was formed in the exposure light-blocking films 36 and 40 and porous insulating film 38 to embed an interconnection therein. The top surface of the conductor plug 34 is exposed at the bottom of the trench 46. Subsequently, the photoresist film 42 was peeled off.

Figure 2G:
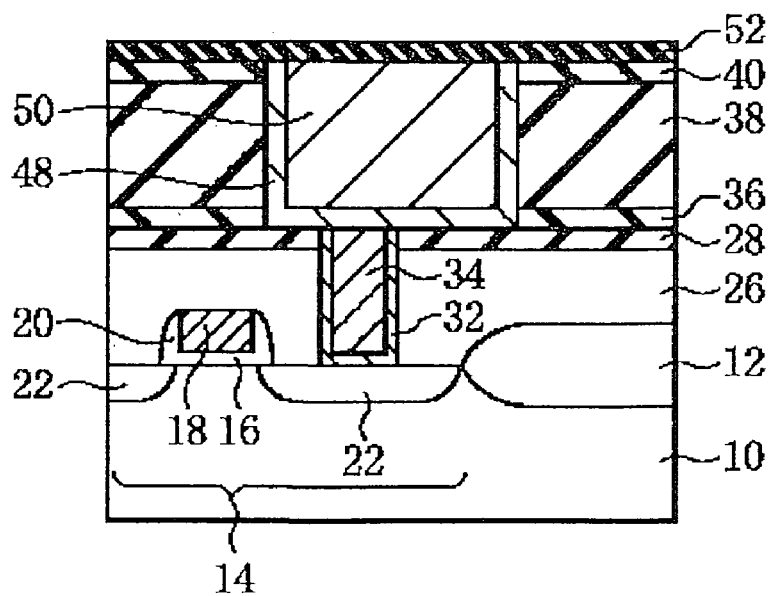
FIG. 2G is a seventh process view of the example of a method for manufacturing the semiconductor device of the present invention which has an exposure light-blocking film formed of the material of the present invention for forming an exposure light-blocking film.

A barrier film (not shown), which is 10 nm in thickness and is made of TaN, was then formed on the entire surface by sputtering. The barrier film has a function of preventing Cu contained in the interconnection to be described later from being diffused in the porous insulating film 38. Next, a seed film (not shown), which is 10 nm in thickness and is made of Cu, was formed on the entire surface by sputtering. The seed film serves as an electrode when an interconnection made of Cu is formed by electroplating. In this way a laminate film 48 formed of the barrier film and the seed film was formed, as shown in FIG. 2G.

Subsequently, a Cu film 50 of 600 nm thickness was formed by electroplating.

Moreover, both the Cu film 50 and the laminate film 48 were polished by CMP (Chemical Mechanical Polishing), until the time when the surface of the exposure light-blocking film 40 was exposed. By this, an interconnection 50 made of Cu was embedded in the trench 46. The manufacturing process for the interconnection 50 described above is a so-called Single Damascene process.

Using the foregoing material for forming an exposure light-blocking film thus prepared, an exposure light-blocking film 52 of 30 nm thickness was then formed in a manner similar to that used for the formation of the exposure light-blocking films 36 and 40.

Figure 2H:
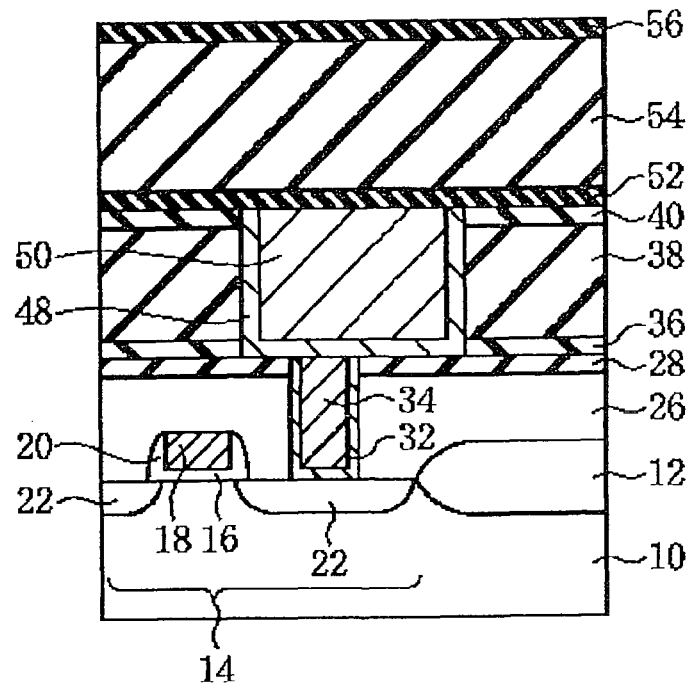
FIG. 2H is an eighth process view of the example of a method for manufacturing the semiconductor device of the present invention which has an exposure light-blocking film foamed of the material of the present invention for forming an exposure light-blocking film.

Next, a porous insulating film 54 of 180 nm thickness was formed in a manner similar to that used for the formation of the porous insulating film 38, as shown in FIG. 2H. The porous insulating film 54 was cured by irradiation with ultraviolet light under conditions similar to those for the curing of the porous insulating film 38.

Using the foregoing material for forming an exposure light-blocking film prepared above, an exposure light-blocking film 56 of 30 nm thickness was formed on the entire surface of the porous insulating film 54 in a manner similar to that used for the formation of the exposure light-blocking films 36, 40 and 52.

Figure 2I:
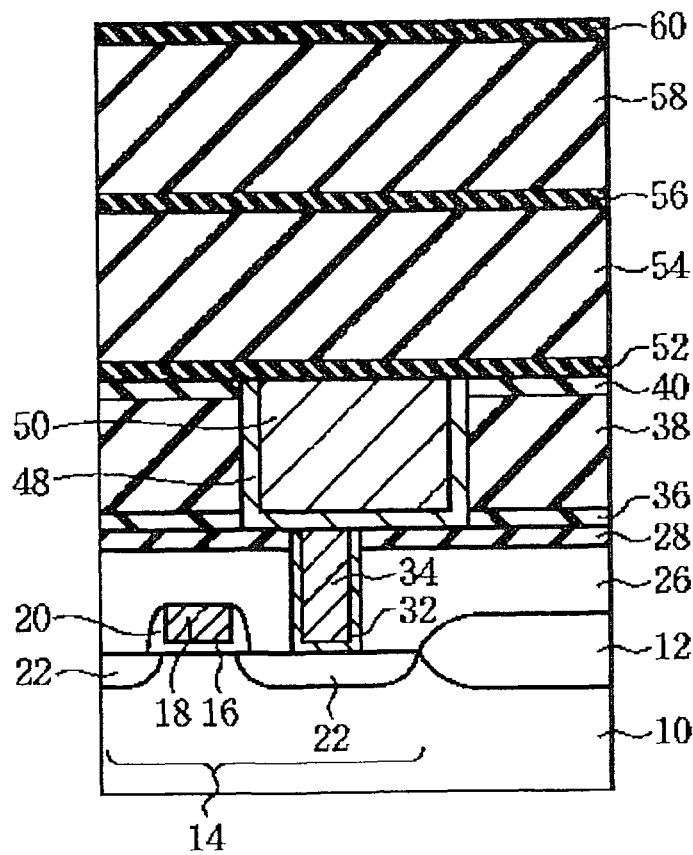
FIG. 2I is a ninth process view of the example of a method for manufacturing the semiconductor device of the present invention is which has an exposure light-blocking film formed of the material of the present invention for forming an exposure light-blocking film.

Next, a porous insulating film 58 of 160 nm thickness was formed in a manner similar to that used for the formation of the porous insulating film 38, as shown in FIG. 2I. The porous insulating film 58 was cured by irradiation with ultraviolet light under conditions similar to those for the curing of the porous insulating film 38. Subsequently, using the foregoing material for forming an exposure light-blocking film prepared above, an exposure light-blocking film 60 of 30 nm thickness was formed on the entire surface of the porous insulating film 58 in a manner similar to that used for the formation of the exposure light-blocking films 36, 40 and 52.

Figure 2J:
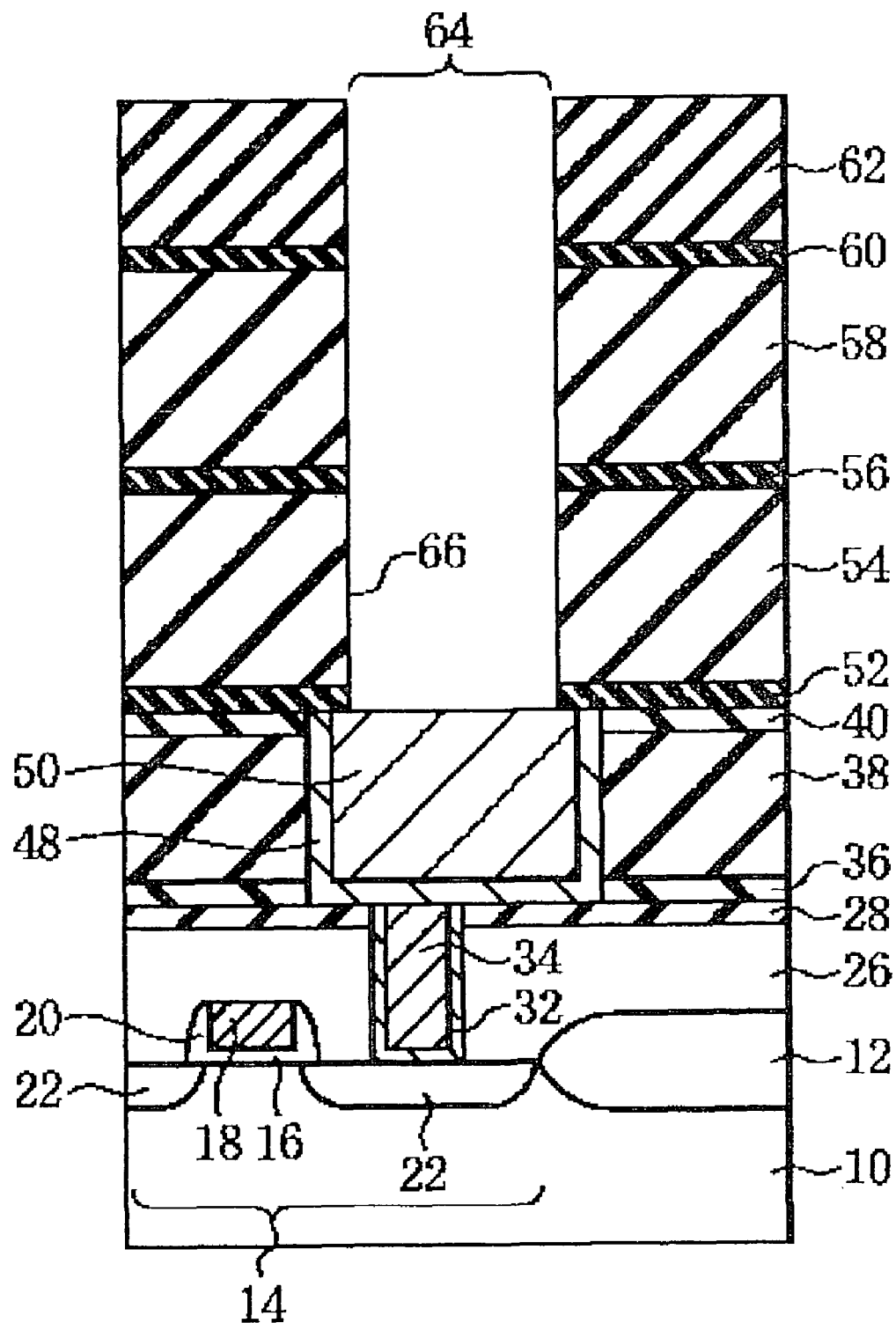
FIG. 2J is a tenth process view of the example of a method for manufacturing the semiconductor device of the present invention which has an exposure light-blocking film formed of the material of the present invention for forming an exposure light-blocking film.

As shown in FIG. 2J, a photoresist film 62 was formed on the entire surface by spin coating. An opening 64 was formed in the photoresist film 62 using photolithography. The opening 64 is one in which a contact hole 66 that reaches the first interconnection (first metal interconnection layer) 50 is formed. Using the photoresist film 62 as a mask, the exposure light-blocking films 52, 56 and 60 and porous insulating films 54 and 58 were subjected to an etching treatment, where fluorine plasma derived from $CF_4$ gas and $CHF_3$ gas was used and the compositions of the etching gas and etching pressure and the like were appropriately changed. In this way a contact hole 66 that reaches the interconnection 50 was formed. Subsequently, the photoresist film 62 was peeled off.

Figure 2K:
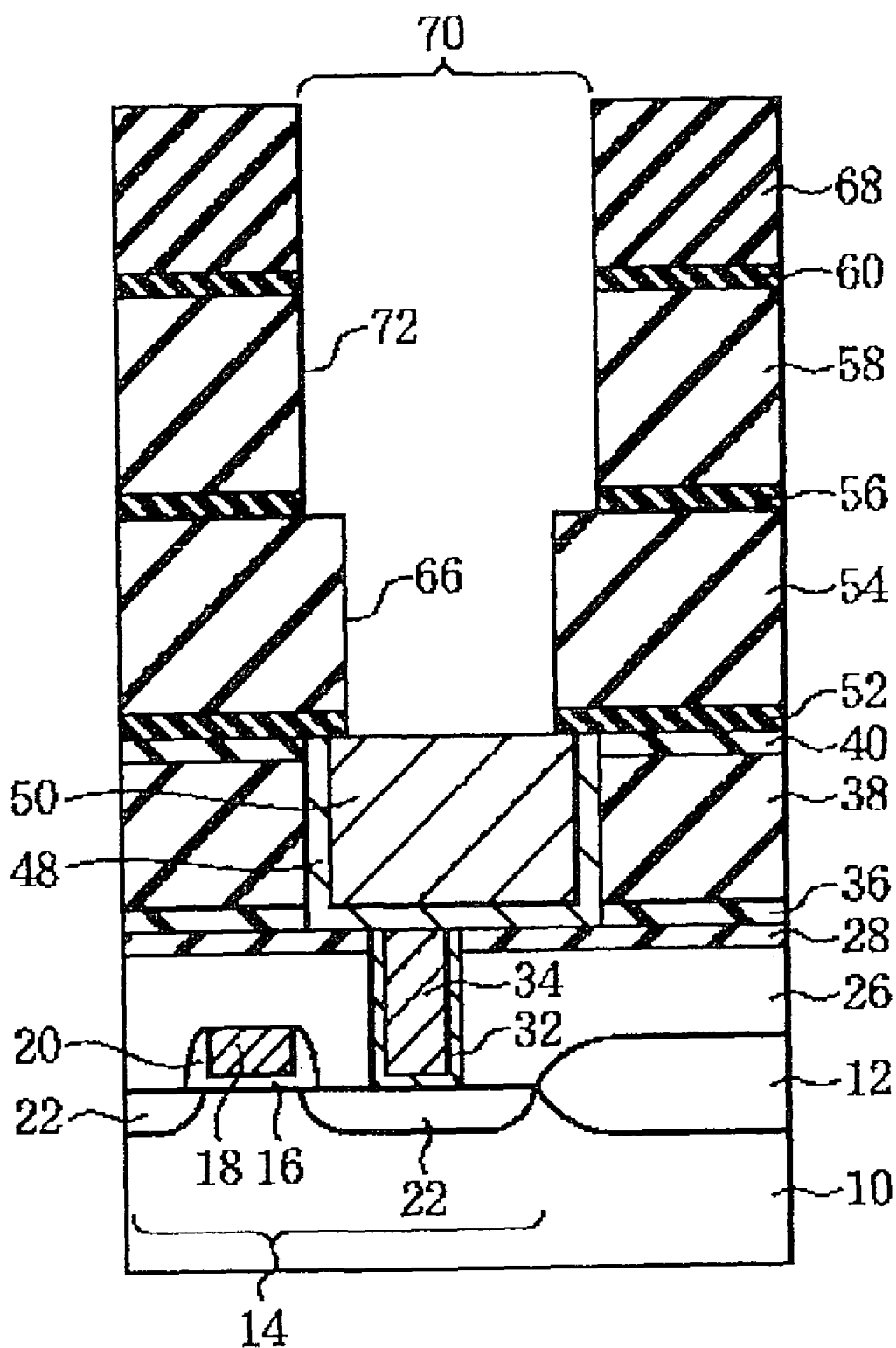
FIG. 2K is an eleventh process view of the example of a method for manufacturing the semiconductor device of the present invention which has an exposure light-blocking film formed of the material of the present invention for forming an exposure light-blocking film.
Figure 2L:
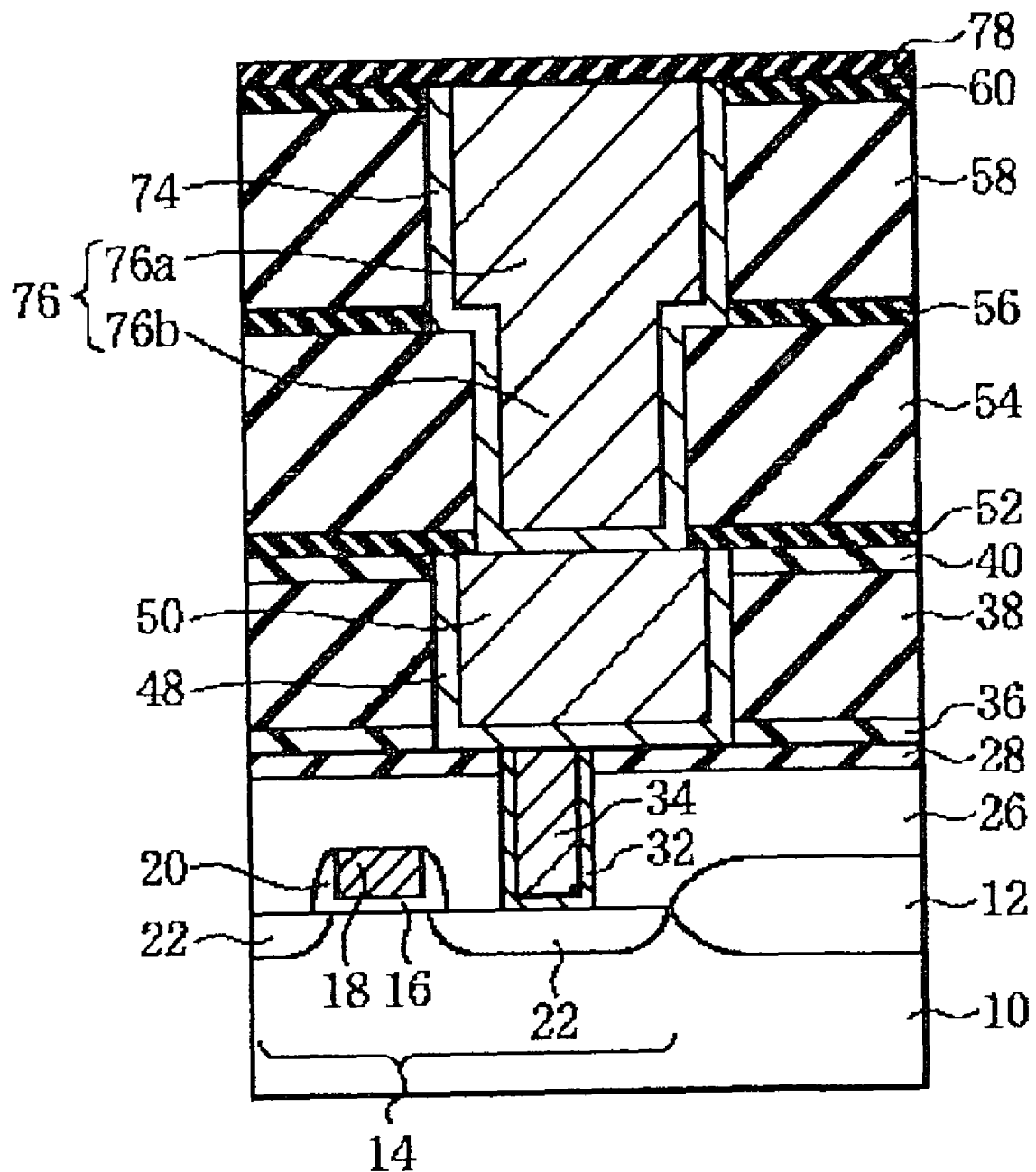
FIG. 2L is a twelfth process view of the example of a method for manufacturing the semiconductor device of the present invention which has an exposure light-blocking film formed of the material of the present invention for forming an exposure light-blocking film.

Next, as shown in FIG. 2K, a photoresist film 68 was formed on the entire surface by spin coating. An opening 70 was then formed in the photoresist film 68 using photolithography. The opening 70 is one in which a second interconnection (second metal interconnection layer) 76a (see FIG. 2L) is formed.

Using the photoresist film 68 as a mask, the exposure light-blocking films 56 and 60 and porous insulating film 58 were subjected to an etching treatment, where fluorine plasma derived from $CF_4$ gas and $CHF_3$ gas was used. In this way a trench 72 was formed for embedding an interconnection 76a in the exposure light-blocking films 56 and 60 and porous insulating film 58. Here, the trench 72 is connected to the contact hole 66.

A barrier film (not shown), which is 10 nm in thickness and is made of TaN, was then formed on the entire surface by sputtering. The barrier film has a function of preventing Cu contained in the interconnection 76a a conductor plug 76b to be described later from being diffused in the porous insulating films 54 and 58. Next, a seed film (not shown), which is 10 nm in thickness and is made of Cu, was formed on the entire surface by sputtering. The seed film serves as an electrode when the interconnection 76a and conductor plug 76b that are made of Cu are formed by electroplating. In this way a laminate film 74 formed of the barrier film and the seed film was formed, as shown in FIG. 2G.

Subsequently, a Cu film 76 of 1,400 nm thickness was formed by electroplating.

Moreover, both the Cu film 76 and the laminate film 74 were polished by CMP (Chemical Mechanical Polishing), until the time when the surface of the exposure light-blocking film 60 was exposed. In this way the conductor plug 76b made of Cu was embedded in the contact hole 66, and the interconnection 76a made of Cu was embedded in the trench 72. The conductor plug 76b and the interconnection 76a were formed as a single piece. The manufacturing method in which the conductor plug 76b and the interconnection 76a are formed as a single piece is a so-called Dual Damascene method.

Subsequently, using the foregoing material for forming an exposure light-blocking film prepared above, an exposure light-blocking film 78 of 30 nm thickness was formed on the entire surface in a manner similar to that used for the formation of the exposure light-blocking films 36, 40 and 52.

Thereafter, these steps were repeatedly performed to form an unillustrated third interconnection (third metal interconnection layer), forming a semiconductor device.

In this way interconnections and conductor plugs were formed so that one million conductor plugs are electrically connected in series, and semiconductor device manufacturing yields were determined to be 91%. In addition, the effective relative permittivity calculated on the basis of the capacities between layers was 2.6. Furthermore, after allowing the semiconductor device to stand at 200° C. for 3,000 hours, the interconnection resistance was measured using a resistance measurement device (HP4282A manufactured by Agilent Technologies); the interconnection resistance was not increased.

The reduction in the amounts of the porous insulating films provided below the exposure light-blocking film, determined using a spectroscopic ellipsometer (GES500, manufactured by SOPRA Inc.), was 0 nm in terms of thickness, leading to a conclusion that the amount of each porous insulating film was not reduced. These results are shown in FIG. 1.

Examples 2 to 12

Semiconductor devices were manufactured in a manner similar to that described in Example 1 except that the material for forming an exposure light-blocking film was changed to those shown in Table 1 and an exposure light-blocking film was formed as the first interlayer insulating film. In addition, the effective permittivities of the resultant semiconductor devices, semiconductor device manufacturing yields, and the reduction in the amounts of the porous insulating films provided below the exposure light-blocking film were measured in a manner similar to that described in Example 1. The results are also shown in Table 1.

Note in Examples 2, 4, 6, 8, 10 and 12 that as the third interlayer insulating film a SiC film capable of admitting ultraviolet light was formed on the porous insulating film that serves as the second interlayer insulating film, and that ultraviolet light was applied on the porous insulating film for curing through the SiC film.

Comparative Examples 1 to 4

Semiconductor devices were manufactured in a manner similar to that described in Example 1 except that the material for forming an exposure light-blocking film was changed to those shown in Table 1, where a functional group of a silicone compound is not replaced by a substituent capable of absorbing ultraviolet light, and that an exposure light-blocking film was formed as the first interlayer insulating film. After allowing the semiconductor devices to stand at 200° C. for 3,000 hours, their interconnection resistance was measured using a resistance measurement device (HP4782A manufactured by Agilent Technologies); the interconnection resistance was increased. In addition, semiconductor device manufacturing yields, the effective permittivities of the resultant semiconductor devices, and the reduction in the amounts of the porous insulating films provided below the exposure light-blocking film were measured in a manner similar to that described in Example 1. The results are also shown in Table 1.

Note in Comparative Examples 2 and 4 that as the third interlayer insulating film a SiC film capable of admitting ultraviolet light was formed on the porous insulating film that serves as the second interlayer insulating film, and that ultraviolet light was applied on the porous insulating film for curing through the SiC film.

TABLE 1

| | Material for exposure light-blocking film | | | | | |
|---|---|---|---|---|---|---|
| | Silicon compound expressed by structural formula (1) or (2) | Substituent capable of absorbing ultraviolet light | Interlayer film capable of admitting ultraviolet light | Reduction amount of lower porous insulating films (nm) | Effective Permittivity | Yield (%) |
| Example 1 | Polycarbosilane expressed by structural formula (1) | Vinyl group | — | 0 | 2.6 | 91 |
| Example 2 | | | SiC | 0 | 2.6 | 88 |
| Example 3 | | Benzyl group | — | 0 | 2.6 | 92 |
| Example 4 | | | SiC | 0 | 2.6 | 93 |
| Example 5 | | Diazo group | — | 0 | 2.6 | 89 |
| Example 6 | | | SiC | 0 | 2.6 | 87 |
| Example 7 | Polysilazane expressed by structural formula (1) | Vinyl group | — | 0 | 2.7 | 87 |
| Example 8 | | | SiC | 0 | 2.6 | 88 |
| Example 9 | | Benzyl group | — | 0 | 2.6 | 92 |
| Example 10 | | | SiC | 0 | 2.7 | 91 |
| Example 11 | | Diazo group | — | 0 | 2.6 | 87 |
| Example 12 | | | SiC | 0 | 2.7 | 90 |
| Comparative Example 1 | Polycarbosilane expressed by structural formula (1) | (Not substituted) | — | 5 | 3.1 | 57 |
| Comparative Example 2 | | | SiC | 6 | 3.0 | 53 |
| Comparative Example 3 | Polysilazane expressed by structural formula (2) | (Not substituted) | — | 4 | 3.2 | 48 |
| Comparative Example 4 | | | SiC | 5 | 3.0 | 52 |

It can be learned from the results shown in Table 1 that since the exposure light-blocking films of Examples 1 to 12 were formed of the material of the present invention that contains a silicon compound substituted with a substituent capable of absorbing ultraviolet light, ultraviolet light did not reach porous insulating films provided below the exposure target (a porous insulating film to be exposed) and thus the amounts of the porous insulating films other than the exposure target were not reduced, the effective permittivities of the resultant semiconductor devices were generally low, and semiconductor device manufacturing yields were high. By contrast, in Comparative Examples 1 to 4 where silicon compounds that are not substituted with a substituent capable of absorbing ultraviolet light were used in the exposure light-blocking films, the amounts of the porous insulating films provided below the exposure light-blocking film were reduced, the effective permittivities of the resultant semiconductor devices were low, and semiconductor device manufacturing yields were low.

According to the present invention, it is possible to solve the conventional problems and to provide an exposure light-blocking film which has a high exposure light (particularly ultraviolet light) absorptivity, which efficiently blocks exposure light that reaches porous insulating films below an exposure target, and which is capable of reducing the permittivities the porous insulating films without impairing their functions; a material for forming an exposure light-blocking film, which is suitably used for the formation of the exposure light-blocking film; a multilayer interconnection structure in which the parasitic capacity between adjacent interconnections can be reduced and an efficient mass-production method for the same; and a high-speed, highly-reliable semiconductor device provided with the multilayer interconnection structure and a manufacturing method thereof.

Since the material of the present invention for an exposure light-blocking film is excellent in the ability of absorbing exposure light (e.g., ultraviolet light), it can be suitably used for the formation of the exposure light-blocking film of the present invention that has a function to block the exposure light, particularly for the manufacturing of the multilayer interconnection structure and semiconductor device of the present invention.

With the method of the present invention for manufacturing a multilayer interconnection structure, it is possible to reduce the permittivities of porous insulating films without impairing their functions and to improve semiconductor device manufacturing yields. Thus, the method of the present invention for manufacturing a multilayer interconnection structure can be suitably used for the manufacturing of the multilayer interconnection structure of the present invention.

The multilayer interconnection structure of the present invention can achieve high-speed signal propagation and is particularly suitable, for example, for semiconductor integrated circuits that require higher response speed.

The semiconductor device of the present invention can reduce both the parasitic capacity between interconnections and the interconnection resistance, and is highly reliable. Thus, the semiconductor device of the present invention is suitable, for example, for flash memories, DRAMs, FRAMs, and MOS transistors.

What is claimed is:

1. A multilayer interconnection structure, comprising:
   an exposure light-blocking film;
   a porous insulating film; and
   an interconnection layer,
   wherein the exposure light-blocking film is formed by use of a material for forming an exposure light-blocking film,
   wherein the material comprises a silicon compound expressed by the following structural formula (1), wherein in the structural formula (1) at least one of $R^1$ and $R^2$ is one selected from the group consisting of a benzyl group and diazo group

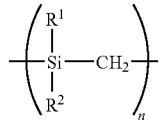

Structural Formula (1)

(where $R^1$ and $R^2$ may be the same or different, and n is an integer of 2 or greater).

2. The multilayer interconnection structure according to claim 1, wherein n in the structural formula (1) is an integer of 10 to 1,000.

3. The multilayer interconnection structure according to claim 1, wherein the exposure light-blocking film and the porous insulating film are in contact with each other.

4. The multilayer interconnection structure according to claim 1, wherein the exposure light-blocking film has a thickness of 5 nm to 70 nm.

5. A multilayer interconnection structure, comprising:
an exposure light-blocking film;
a porous insulating film; and
an interconnection layer,
wherein the exposure light-blocking film is formed by use of a material for forming an exposure light-blocking film,
wherein the material comprises a silicon compound expressed by the following structural formula (2),
wherein in the structural formula (2) at least one of $R^1$ and $R^2$ is replaced by a substituent capable of absorbing exposure light

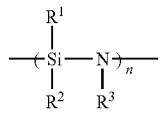

Structural Formula (2)

(where $R^1$, $R^2$ and $R^3$ may be the same or different, at least one of $R^1$, $R^2$ and $R^3$ represents a hydrogen atom and the others represent any one of an alkyl group, alkenyl group, cycloalkyl group and aryl group which are optionally substituted, and n is an integer of 2 or greater).

6. The multilayer interconnection structure according to claim 5, wherein the exposure light-blocking film and the porous insulating film are in contact with each other.

7. The multilayer interconnection structure according to claim 5, wherein the exposure light-blocking film has a thickness of 5 nm to 70 nm.

8. The multilayer interconnection structure according to claim 5, wherein the exposure light is ultraviolet light.

9. The multilayer interconnection structure according to claim 8, wherein the substituent capable of absorbing ultraviolet light comprises at least one of a double bond, a triple bond and an aryl group which may contain a hetero atom.

10. The multilayer interconnection structure according to claim 9, wherein the substituent capable of absorbing ultraviolet light is at least one selected from the group consisting of a vinyl group, acroyl group, benzyl group, phenyl group, carbonyl group, carboxyl group, diazo group, azide group, cinnamoyl group, acrylate group, cinnamylidene group, cyanocinnamylidene group, furylpentadiene group and p-phenylenediacrylate group.

11. The multilayer interconnection structure according to claim 5, wherein the silicon compound expressed by the structural formula (2) has a number-average molecular weight of 100 to 50,000.

12. A multilayer interconnection structure, comprising:
an exposure light-blocking film;
a porous insulating film; and
an interconnection layer,
wherein the exposure light-blocking film is formed by use of a material for forming an exposure light-blocking film,
wherein the material comprises at least one of:
a silicon compound expressed by the following structural formula (1); and
a silicon compound expressed by the following structural formula (2),
wherein in the structural formula (2) at least one of $R^1$ and $R^2$ is replaced by a substituent capable of absorbing exposure light, and in the structural formula (1) at least one of $R^1$ and $R^2$ is one selected from the group consisting of a benzyl group and diazo group Structural Formula (1)

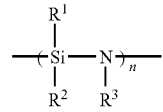

(where $R^1$ and $R^2$ may be the same or different, and n is an integer of 2 or greater)

Structural Formula (2)

(where $R^1$, $R^2$ and $R^3$ may be the same or different, at least one of $R^1$, $R^2$ and $R^3$ represents a hydrogen atom and the others represent any one of an alkyl group, alkenyl group, cycloalkyl group and aryl group which are optionally substituted, and n is an integer of 2 or greater).

13. The multilayer interconnection structure according to claim 12, wherein the exposure light-blocking film and the porous insulating film are in contact with each other.

14. The multilayer interconnection structure according to claim 12, wherein the exposure light-blocking film has a thickness of 5 nm to 70 nm.

15. The multilayer interconnection structure according to claim 12, wherein n in the structural formula (1) is an integer of 10 to 1,000.

16. The multilayer interconnection structure according to claim 12, wherein the exposure light is ultraviolet light.

17. The multilayer interconnection structure according to claim 16, wherein the substituent capable of absorbing ultraviolet light comprises at least one of a double bond, a triple bond and an aryl group which may contain a hetero atom.

18. The multilayer interconnection structure according to claim 17, wherein the substituent capable of absorbing ultraviolet light is at least one selected from the group consisting of a vinyl group, acroyl group, benzyl group, phenyl group, carbonyl group, carboxyl group, diazo group, azide group, cinnamoyl group, acrylate group, cinnamylidene group, cyanocinnamylidene group, furylpentadiene group and p-phenylenediacrylate group.

19. The multilayer interconnection structure according to claim 12, wherein the silicon compound expressed by the structural formula (2) has a number-average molecular weight of 100 to 50,000.

* * * * *